(12) United States Patent
Wu

(10) Patent No.: US 11,302,865 B2
(45) Date of Patent: Apr. 12, 2022

(54) PHASE-CHANGE MEMORY WITH TWO-PORTIONED PHASE-CHANGE LAYER

(71) Applicant: Taiwan Semiconductor Manufacturing Company, Ltd., Hsinchu (TW)

(72) Inventor: Jau-Yi Wu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 51 days.

(21) Appl. No.: 16/727,155

(22) Filed: Dec. 26, 2019

(65) Prior Publication Data
US 2021/0202834 A1 Jul. 1, 2021

(51) Int. Cl.
*H01L 45/00* (2006.01)
(52) U.S. Cl.
CPC .......... *H01L 45/122* (2013.01); *H01L 45/06* (2013.01); *H01L 45/1253* (2013.01); *H01L 45/1608* (2013.01)
(58) Field of Classification Search
CPC .............. H01L 45/122; H01L 45/1608; H01L 45/1253; H01L 45/06
See application file for complete search history.

(56) References Cited

U.S. PATENT DOCUMENTS

| | | | | |
|---|---|---|---|---|
| 2004/0262635 | A1* | 12/2004 | Lee | H01L 29/792 257/199 |
| 2006/0006374 | A1* | 1/2006 | Chang | H01L 45/1691 257/2 |
| 2007/0025226 | A1* | 2/2007 | Park | H01L 45/143 369/100 |
| 2010/0301480 | A1* | 12/2010 | Choi | H01L 45/06 257/751 |
| 2015/0090954 | A1* | 4/2015 | Li | H01L 45/144 257/4 |
| 2018/0040814 | A1* | 2/2018 | Park | G06F 3/0673 |

* cited by examiner

*Primary Examiner* — Jerome Leboeuf
(74) *Attorney, Agent, or Firm* — Slater Matsil, LLP

(57) ABSTRACT

A device includes a substrate, a first dielectric layer over the substrate, a bottom electrode extending through the first dielectric layer, a phase-change layer over the bottom electrode, and a top electrode over the phase-change layer. The phase-change layer includes a first portion extending into the bottom electrode and a second portion over the first portion and the first dielectric layer. A width of the first portion decreases as the first portion extends toward the substrate. The second portion has a first width. The top electrode has the first width.

20 Claims, 17 Drawing Sheets

PHASE-CHANGE MEMORY WITH TWO-PORTIONED PHASE-CHANGE LAYER

BACKGROUND

Phase change technology is promising for next generation memories. It uses chalcogenide semiconductors for storing states. The chalcogenide semiconductors, also called phase change materials, have a crystalline state and an amorphous state. In the crystalline state, the phase change materials have a low resistivity, while in the amorphous state they have a high resistivity. The resistivity ratios of the phase change materials in the amorphous and crystalline states are typically greater than 1000 and thus the phase change memory devices are unlikely to have erroneous reading. The chalcogenide materials are stable at certain temperature ranges in both crystalline and amorphous states and can be switched back and forth between the two states by electric pulses. One type of memory device that uses the principal of phase change in chalcogenide semiconductors is commonly referred to as phase-change random access memory (PCRAM).

PCRAM has several operating and engineering advantages, including high speed, low power, non-volatility, high density, and low cost. For example, PCRAM devices are non-volatile and may be written into rapidly, for example, within less than about 50 nanoseconds. The PCRAM cells may have a high density. In addition, PCRAM memory cells are compatible with CMOS logic and can generally be produced at a low cost compared to other types of memory cells.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
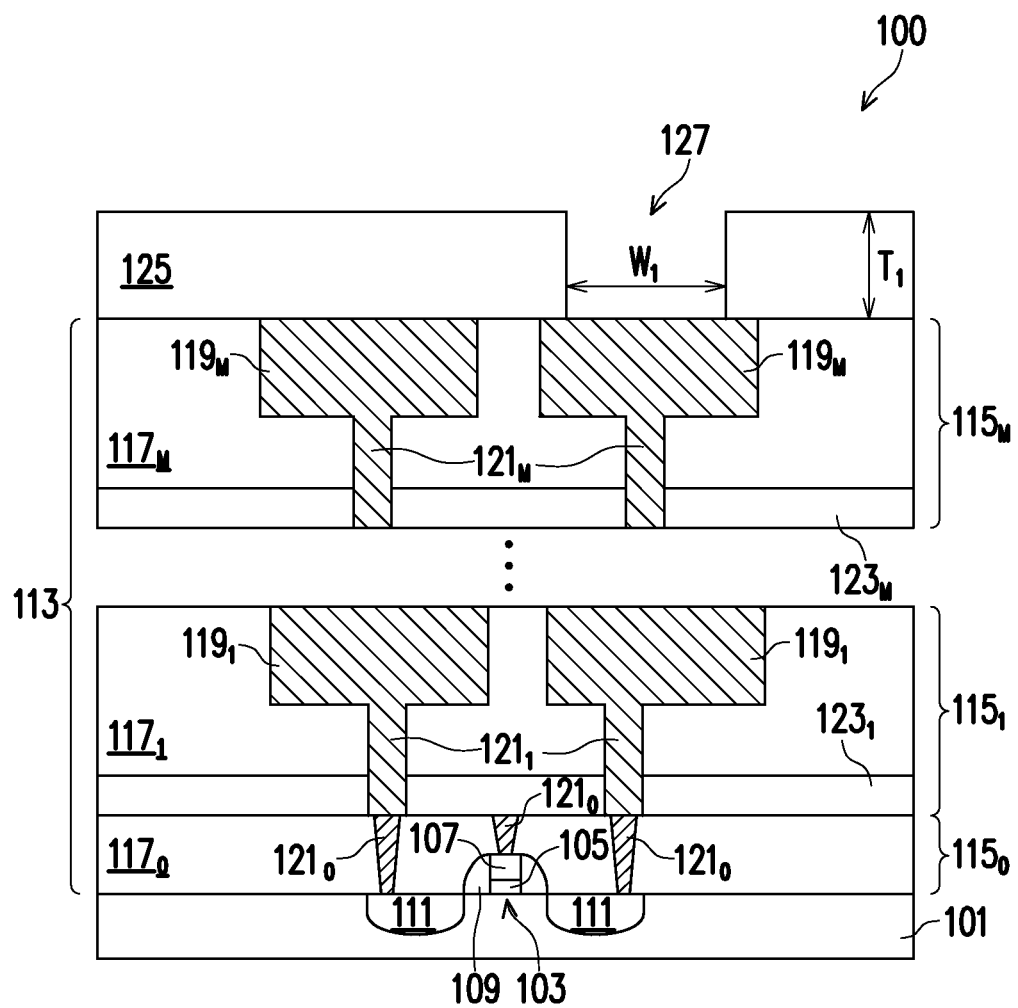
FIGS. 1-7 illustrate cross-sectional views of intermediate stages in the manufacturing of a phase-change random access memory (PCRAM) cell in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to a specific context, namely, a semiconductor device, such a phase-change random access memory (PCRAM) device, and a method of forming the same. By forming a recess in a bottom electrode of a PCRAM structure, a width of the bottom electrode is reduced without using advanced photolithography and etch processes, which allows for process cost reduction. By reducing the width of the bottom electrode, a write current and a write power of a PCRAM device are reduced.

FIGS. 1-7 illustrate cross-sectional views of intermediate stages in the manufacturing of a PCRAM cell 100 in accordance with some embodiments. In some embodiments, the PCRAM cell 100 comprises a substrate 101. The substrate 101 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, such as a silicon or glass substrate. Alternatively, the substrate 101 may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

In some embodiments, an access transistor 103 is formed over the substrate 101. The access transistor 103 includes a gate stack comprising a gate dielectric 105 and a gate electrode 107, spacers 109 on opposite sidewalls of the gate stack, and source/drain regions 111 adjacent to the respective spacers 109. For simplicity, components that are commonly formed in integrated circuits, such as gate silicides, source/drain silicides, contact etch stop layers, and the like, are not illustrated. In some embodiments, the access transistor 103 may be formed using any acceptable methods. In some embodiments, the access transistor 103 may be a planar MOSFET, a FinFET, or the like.

In some embodiments, additional active and/or passive devices may be formed on the substrate 101. The one or more active and/or passive devices may include transistors, capacitors, resistors, diodes, photo-diodes, fuses, or the like. The one or more active and/or passive devices may be formed using any acceptable methods. One of ordinary skill in the art will appreciate that the above examples are provided for the purpose of illustration only and are not meant to limit the present disclosure in any manner. Other circuitry may be also used as appropriate for a given application.

In some embodiments, an interconnect structure 113 is formed over the access transistor 103 and the substrate 101. The interconnect structure 113 may comprise one or more metallization layers $115_0$ to $115_M$, wherein M+1 is the number of the one or more metallization layers $115_0$ to $115_M$. In some embodiments, the value of M may vary according to design specifications. In some embodiments, the metallization layer $115_M$ may be an intermediate metallization layer of the interconnect structure 113. In such embodiments, further metallization layers are formed over the metallization layer $115_M$. In some embodiments, M is equal to 1. In other embodiments, M is greater than 1.

In some embodiments, the one or more metallization layers $115_0$ to $115_M$, comprise one or more dielectric layers $117_0$ to $117_M$, respectively. The dielectric layer $117_0$ is an inter-layer dielectric (ILD) layer, and the dielectric layers $117_1$ to $117_M$ are inter-metal dielectric (IMD) layers. The ILD layer and the IMD layers may include low-k dielectric materials having k values, for example, lower than about 4.0 or even 2.0. In some embodiments, the ILD layer and IMD layers may be made of, for example, phosphosilicate glass (PSG), borophosphosilicate glass (BPSG), fluorosilicate glass (FSG), SiOxCy, Spin-On-Glass, Spin-On-Polymers, silicon carbon material, compounds thereof, composites thereof, combinations thereof, or the like, formed by any suitable method, such as spin-on coating, chemical vapor deposition (CVD), plasma-enhanced CVD (PECVD), atomic layer deposition (ALD), a combination thereof, or the like.

In some embodiments, etch stop layers (ESLs) $123_1$ to $123_M$ are formed between adjacent ones of the dielectric layers $117_0$ to $117_M$. A material for the ESLs $123_1$ to $123_M$ is chosen such that etch rates of the ESLs $123_1$ to $123_M$ are less then etch rates of corresponding ones of the dielectric layers $117_1$ to $117_M$. In some embodiments, an etching process that etches the dielectric layers $117_1$ to $117_M$ faster than the ESLs $123_1$ to $123_M$ is a dry etching process performed using an etchant comprising a $C_xF_y$-based gas, or the like. In some embodiments, an etch rate of the ESL $123_K$ is less than an etch rate of the dielectric layer $117_K$ (with K=1, . . . , M). In some embodiments, each of the ESLs $123_1$ to $123_M$ may comprise one or more layers of dielectric materials. Suitable dielectric materials may include oxides (such as silicon oxide, aluminum oxide, or the like), nitrides (such as SiN, or the like), oxynitrides (such as SiON, or the like), oxycarbides (such as SiOC, or the like), carbonitrides (such as SiCN, or the like), carbides (such as SiC, or the like), combinations thereof, or the like, and may be formed using spin-on coating, CVD, PECVD, ALD, a combination thereof, or the like.

In some embodiments, the metallization layer $115_0$ further comprises conductive plugs $121_0$ within the dielectric layer $117_0$, and the metallization layers $115_1$ to $115_M$ further comprise one or more conductive interconnects, such as conductive lines $119_1$ to $119_M$ and conductive vias $121_1$ to $121_M$, within the dielectric layers $117_1$ to $117_M$, respectively. The conductive plugs $121_0$ electrically couple the source/drain regions 111 and the gate electrode 107 of the access transistor 103 to the conductive lines $119_1$ to $119_M$ and the conductive vias $121_1$ to $121_M$.

In some embodiments, the conductive plugs $121_0$, the conductive lines $119_1$ to $119_M$ and the conductive vias $121_1$ to $121_M$ may be formed using any suitable method, such as a damascene method, a dual damascene method, or the like. In some embodiments, the steps for forming the conductive plugs $121_0$, the conductive lines $119_1$ to $119_M$ and the conductive vias $121_1$ to $121_M$ include forming openings in the respective dielectric layers $117_0$ to $117_M$, depositing one or more barrier/adhesion layers (not explicitly shown) in the openings, depositing seed layers (not explicitly shown) over the one or more barrier/adhesion layers, and filling the openings with a conductive material (not explicitly shown). A chemical mechanical polishing (CMP) is then performed to remove excess materials of the one or more barrier/adhesion layers, the seed layers, and the conductive material overfilling the openings. In some embodiments, topmost surfaces of the conductive plugs $121_0$ are substantially coplanar or level with a topmost surface of the dielectric layer $117_0$ within process variations of the CMP process. In some embodiments, topmost surfaces of the conductive lines $119_1$ to $119_M$ are substantially coplanar or level with topmost surface of the dielectric layers $117_1$ to $117_M$, respectively, within process variations of the CMP process.

In some embodiments, the one or more barrier/adhesion layers may comprise titanium, titanium nitride, tantalum, tantalum nitride, a combination thereof, a multilayer thereof, or the like, and may be formed using physical vapor deposition (PVD), CVD, ALD, a combination thereof, or the like. The one or more barrier/adhesion layers protect the respective dielectric layers $117_0$ to $117_M$ from diffusion and metallic poisoning. The seed layers may comprise copper, titanium, nickel, gold, manganese, a combination thereof, a multilayer thereof, or the like, and may be formed by ALD, CVD, PVD, sputtering, a combination thereof, or the like. The conductive material may comprise copper, aluminum, tungsten, combinations thereof, alloys thereof, multilayers thereof, or the like, and may be formed using, for example, by plating, or other suitable methods.

Referring further to FIG. 1, a dielectric layer 125 is formed over the metallization layer $115_M$. In some embodiments, the dielectric layer 125 may be formed using similar materials and methods as the dielectric layers $117_0$ to $117_M$ and the description is not repeated herein. In some embodiments, the dielectric layer 125 has a thickness $T_1$ between about 40 nm and about 80 nm. Such a range of the thickness $T_1$ of the dielectric layer 125 allows for integrating processes for forming the PCRAM cell 100 with logic processes. In some embodiments, the dielectric layer 125 is patterned to form an opening 127 in the dielectric layer 125. The patterning process may include suitable photolithography and etching methods. In some embodiments, the opening 127 exposes underlying conductive line $119_M$. In some embodiments, the opening 127 has a width $W_1$ between about 10 nm and about 40 nm. Such a range of the width $W_1$ of the opening 127 allows for reducing a write current and a write power of the PCRAM cell 100. In some embodiments, a ratio $W_1/T_1$ is between about 0.2 and about 0.5.

Figure 2:
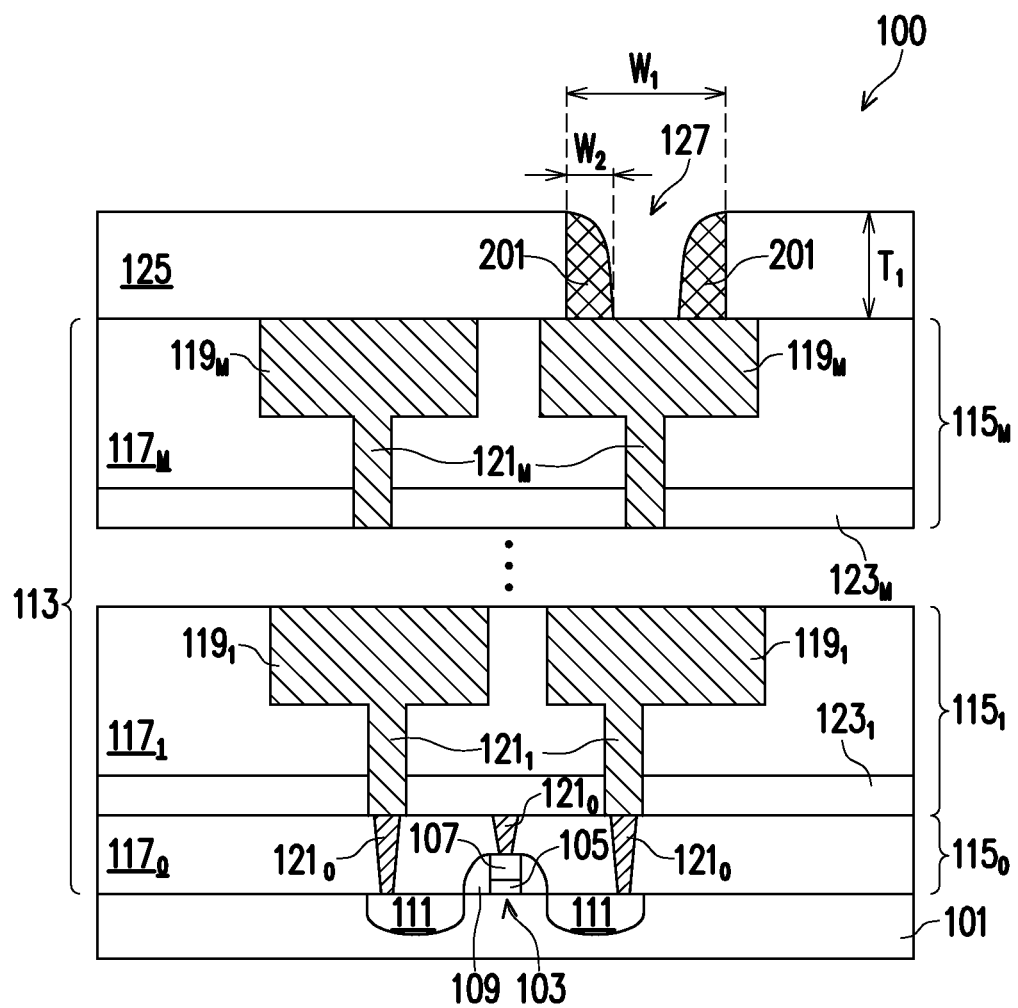

Referring to FIG. 2, spacers 201 are formed on sidewalls of the opening 127. The spacers 201 may be formed using similar materials and methods as the ESLs $123_1$ to $123_M$ described above with reference to FIG. 1 and description is not repeated herein. In some embodiments, process steps for forming the spacers 201 include blanket depositing a dielectric material over the dielectric layer 125 and in the opening 127, anisotropically etching the dielectric layer to remove horizontal portion of the dielectric layer, such that remaining vertical portions of the dielectric material form the spacers 201. In some embodiments, the spacers 201 have a width $W_2$ between about 5 nm and about 20 nm. In some embodiments, a ratio $W_1/W_2$ is between about 2.2 and about 8.

Figure 3:
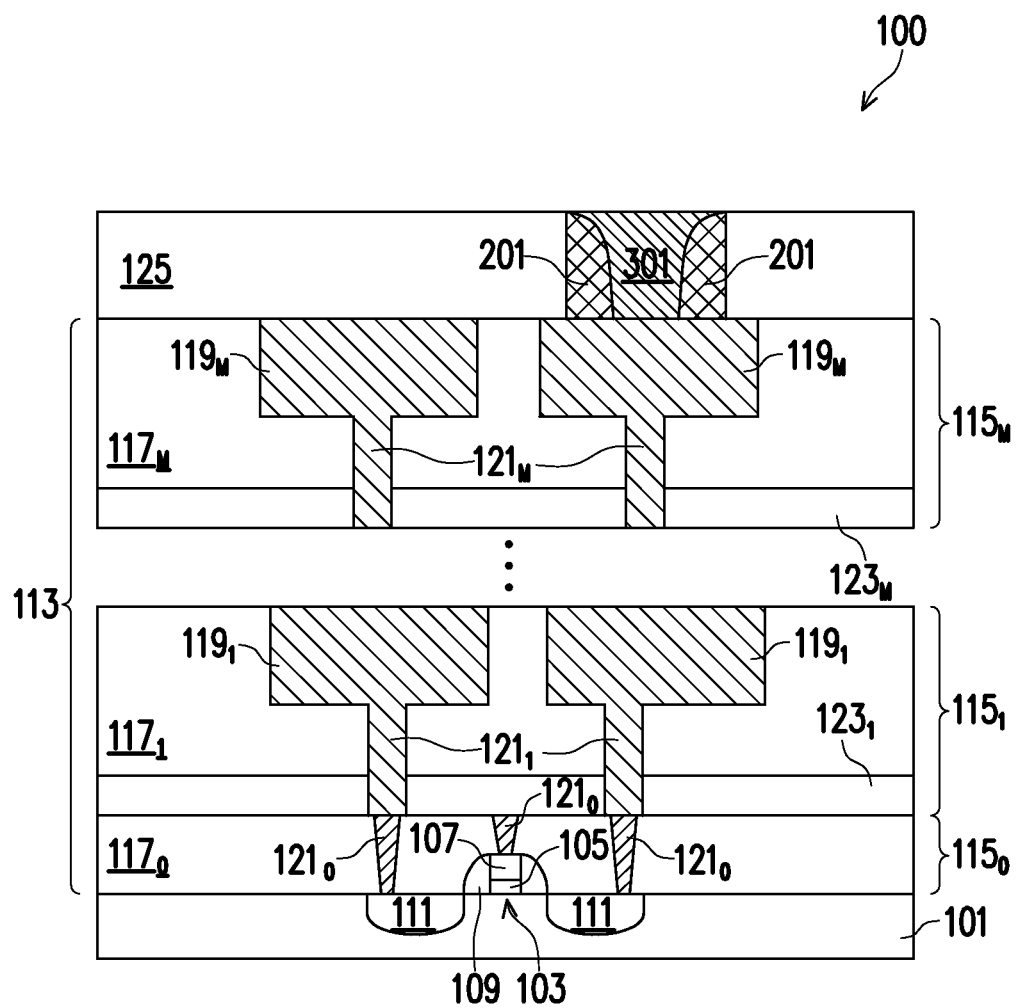

Referring to FIG. 3, a conductive layer 301 is formed in the opening 127 (see FIG. 2). In some embodiments, the conductive layer 301 may comprise a conductive material such as Ti, Co, W, Ru, C, WN, TiN, TiW, TiAl, TiAlN, a combination thereof, a multilayer thereof, or like, and may be formed using CVD, ALD, PVD, a combination thereof, or the like. In some embodiments, the conductive material is deposited in the opening 127 and may overfill the opening 127. In some embodiments, a planarization process, such as a CMP process, an etching process, a grinding process, a combination thereof, or the like, is performed on the conductive material to remove excess portions of the conductive material overfilling the opening 127. In such embodiments, a topmost surface of the conductive layer 301 substantially coplanar or level with a topmost surface of the dielectric layer 125 within process variations of the planarization process. The conductive layer 301 may also be referred to as a bottom electrode. In some embodiments, a width of the conductive layer 301 decreases as the conductive layer 301 extends between the spacers 201 toward the substrate 101. By forming the spacers 201, a width of the conductive layer 301 is reduced to $W_1-2 W_2$ (see FIGS. 1 and 2).

Figure 4:
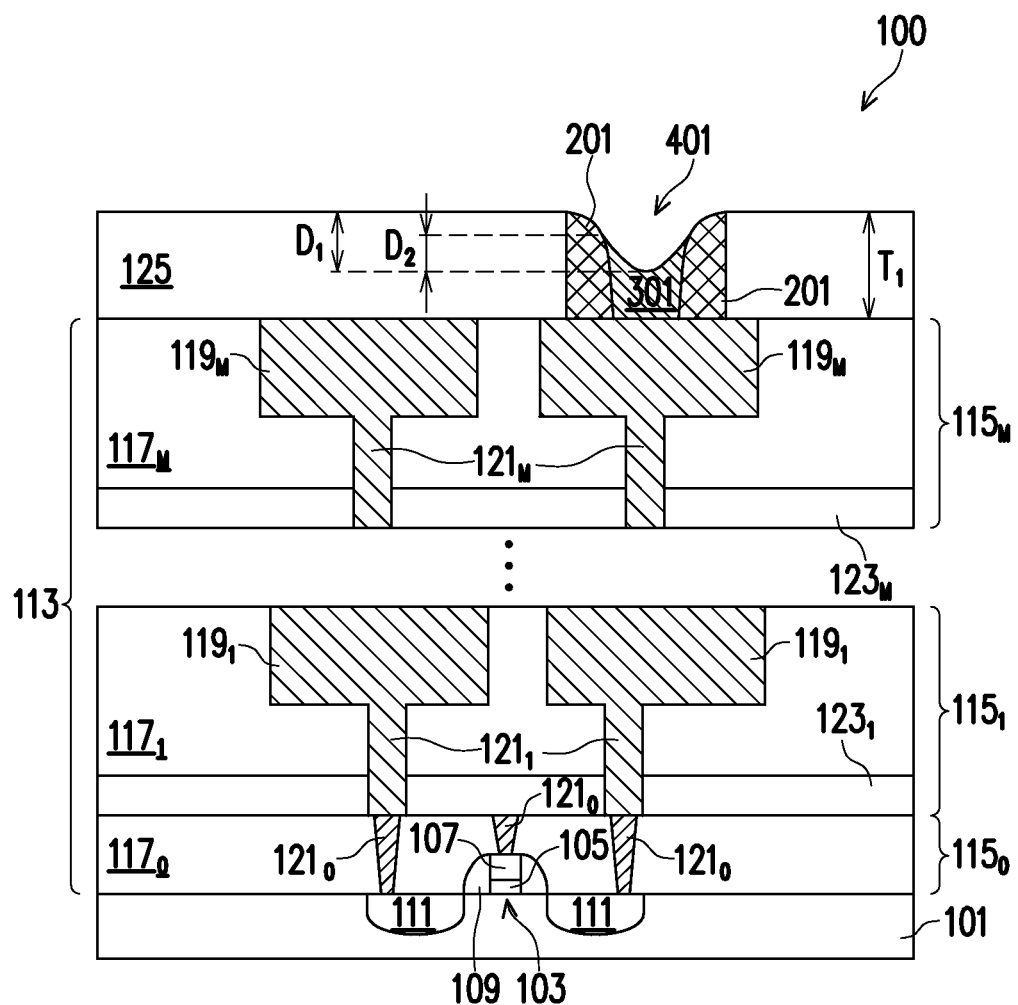

Referring to FIG. 4, the conductive layer 301 is recessed below the topmost surface of the dielectric layer 125 to a depth $D_1$ to form a recess 401. In some embodiments, the recess 401 extends from a topmost surface of the conductive layer 301 into the conductive layer 301 to a depth $D_2$. In some embodiments, the conductive layer 301 has a concave top surface. In some embodiments, a width of the recess 401 decreases as the recess 401 extends into the conductive layer 301 toward to the substrate 101. In some embodiments, a height of the conductive layer 301 is less than a height of the spacers 201 after completing the recessing process. In some embodiments, the conductive layer 301 may be recessed using a suitable etching process. The suitable etching process may be a chemical etch process having high etch selectively for the conductive layer 301 over the spacers 201 and the dielectric layer 125. In some embodiments, the depth $D_1$ is between about 5 nm and about 50 nm. In some embodiments, the depth $D_2$ is between about 0.5 nm and about 20 nm. In some embodiments, a ratio $D_1/D_2$ is between about 5 and about 60. In some embodiments, a ratio $D_1/T_1$ is between about 0.2 and about 0.7. In some embodiments, a ratio $D_2/T_1$ is between about 0.01 and about 0.2.

Figure 5:
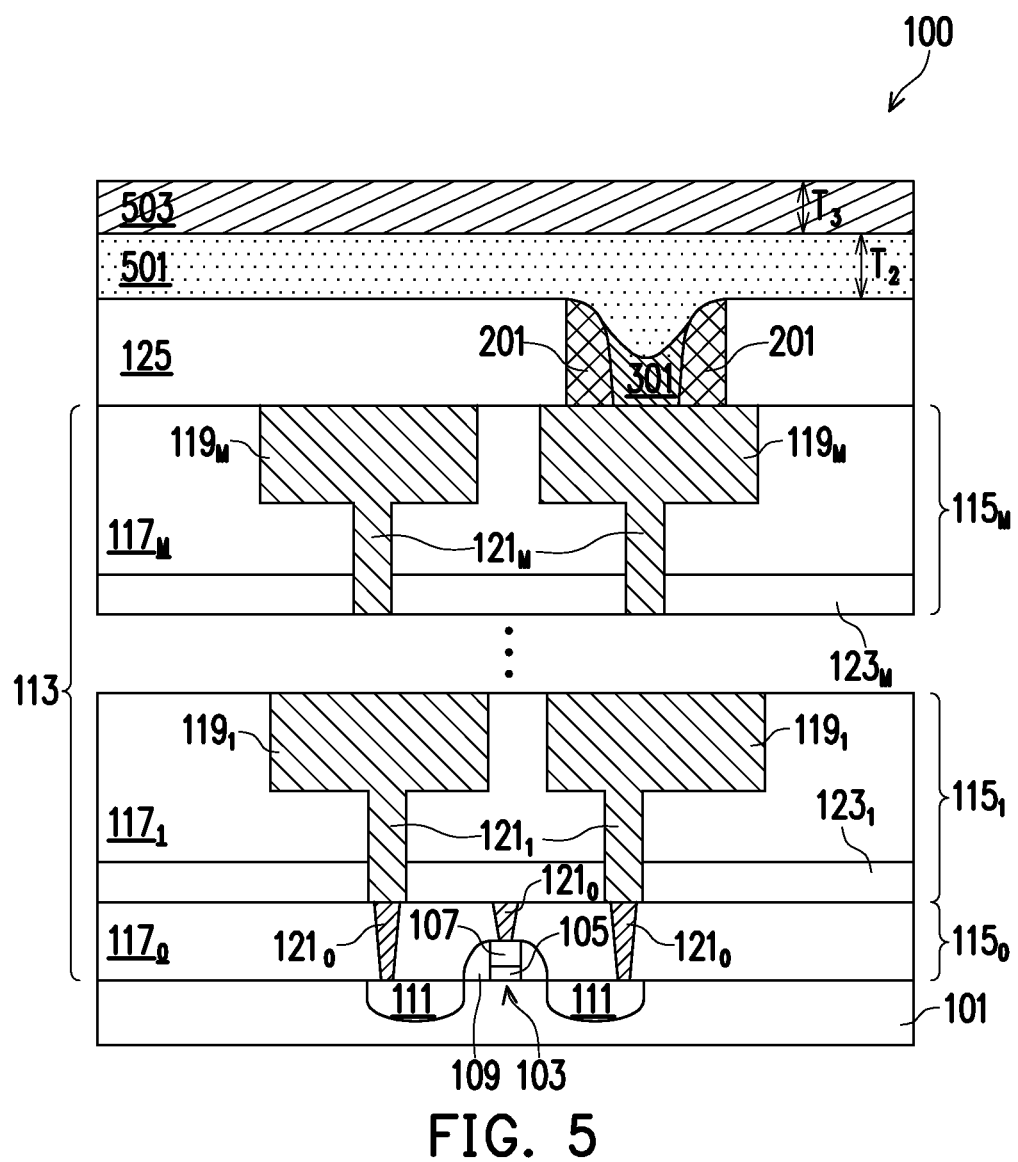

Referring to FIG. 5, a phase-change material 501 is blanket deposited over the conductive layer 301 and the dielectric layer 125. The phase-change material 501 may comprise chalcogenide materials including one or more of Ge, Te, and Sb, e.g., which may be GeSbTe, or stoichiometric materials. The phase-change material 501 may be formed using ALD, CVD, PECVD, a combination thereof, or the like. In some embodiments, the phase-change material 501 has a thickness $T_2$ between about 20 nm and about 100 nm as measured from the topmost surface of the dielectric layer 125.

In some embodiments, a conductive material 503 is blanket deposited over the phase-change material 501. In some embodiments, the conductive material 503 may be formed using similar materials and methods as the conductive layer 301 described above with reference to FIG. 3 and the description is not repeated herein. In some embodiments, the conductive layer 301 and the conductive material 503 may comprise a same material. In other embodiments, the conductive layer 301 and the conductive material 503 may comprise different materials. In some embodiments, the conductive material 503 has a thickness $T_3$ between about 10 nm and about 30 nm.

Figure 6:
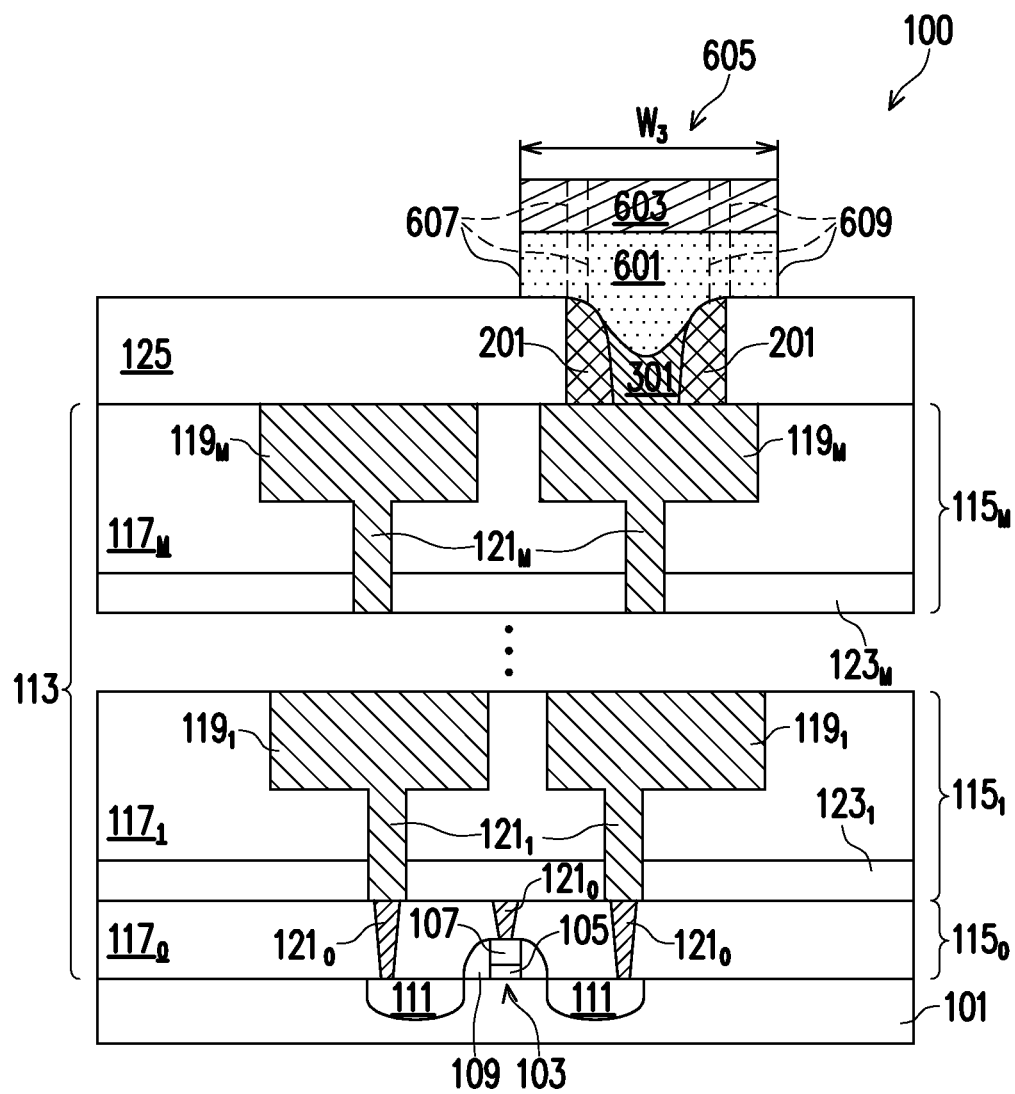

Referring to FIG. 6, the phase-change material 501 and the conductive material 503 (see FIG. 5) are patterned, such that the conductive layer 301 and remaining portions of the phase-change material 501 and the conductive material 503 form a PCRAM structure 605. In some embodiments, the phase-change material 501 and the conductive material 503 may be patterned using suitable photolithography and etching methods. In some embodiments, a single mask may be used to pattern the phase-change material 501 and the conductive material 503. The suitable etching processes may comprise one or more dry etching processes, one or more wet etching processes, a combination thereof, or the like. In some embodiments, the phase-change material 501 and the conductive material 503 are patterned using a single etch process, which may be a physical etch process or a chemical etch process. In other embodiments, the phase-change material 501 and the conductive material 503 are patterned using two different etch processes, with the first etch process patterning the conductive material 503 and the second etch process patterning the phase-change material 501. In some embodiments, the first etch process may be a chemical etch process and the second etch process may be a physical etch process. By using the physical etch process, etch damage of the phase-change material 501 is reduced or avoided. In other embodiments, the first etch process may be a first chemical etch process and the second etch process may be a second chemical etch process. The first chemical etch process may be performed using Cl-containing etchants. The second chemical etch process may be performed using suitable etchants without including Cl-containing etchants. By not using Cl-containing etchants in the second chemical etch, etch damage of the phase-change material 501 is reduced or avoided.

In some embodiments, a remaining portion of the phase-change material 501 forms a phase-change layer 601 and a remaining portion of the conductive material 503 forms a conductive layer 603, such that the PCRAM structure 605 comprises the conductive layer 301, the phase-change layer 601 over the conductive layer 301, and the conductive layer 603 over the phase-change layer 601. The conductive layer 603 may also be referred to as a top electrode. In some embodiments, each of the phase-change layer 601 and the conductive layer 603 has a width $W_3$ between about 10 nm and about 200 nm.

Referring further to FIG. 6, in some embodiments where the width $W_3$ is less than the width $W_1$ of the opening 127 (see FIG. 1), the phase-change layer 601 and the conductive layer 603 completely cover the conductive layer 301 and partially covers the spacers 201 (as indicated by dashed sidewalls 607 and 609 of the PCRAM structure 605). In other embodiments where the width $W_3$ is equal to the width $W_1$ of the opening 127 (see FIG. 1), the phase-change layer 601 and the conductive layer 603 completely cover the conductive layer 301 and the spacers 201 (as indicated by dashed sidewalls 607 and 609 of the PCRAM structure 605). In yet other embodiments where the width $W_3$ is greater than the width $W_1$ of the opening 127 (see FIG. 1), the phase-change layer 601 and the conductive layer 603 completely cover the conductive layer 301 and the spacers 201, and partially cover the dielectric layer 125 (as indicated by solid sidewalls 607 and 609 of the PCRAM structure 605). In some embodiments, the phase-change layer 601 extends into the conductive layer 301 such that a width of the phase-change layer 601 decreases as the phase-change layer 601 extends into the conductive layer 301 toward the substrate 101. In some embodiments, the phase-change layer 601 has a convex bottom surface.

By forming the recess 401 in the conductive layer 301 of the PCRAM structure 605 as described above with reference to FIG. 4, a width of the conductive layer 301 is reduced without using advanced photolithography and etch processes, which allows for process cost reduction. By reducing the width of the conductive layer 301, a write current and a write power of the PCRAM cell 100 are reduced.

Figure 7:
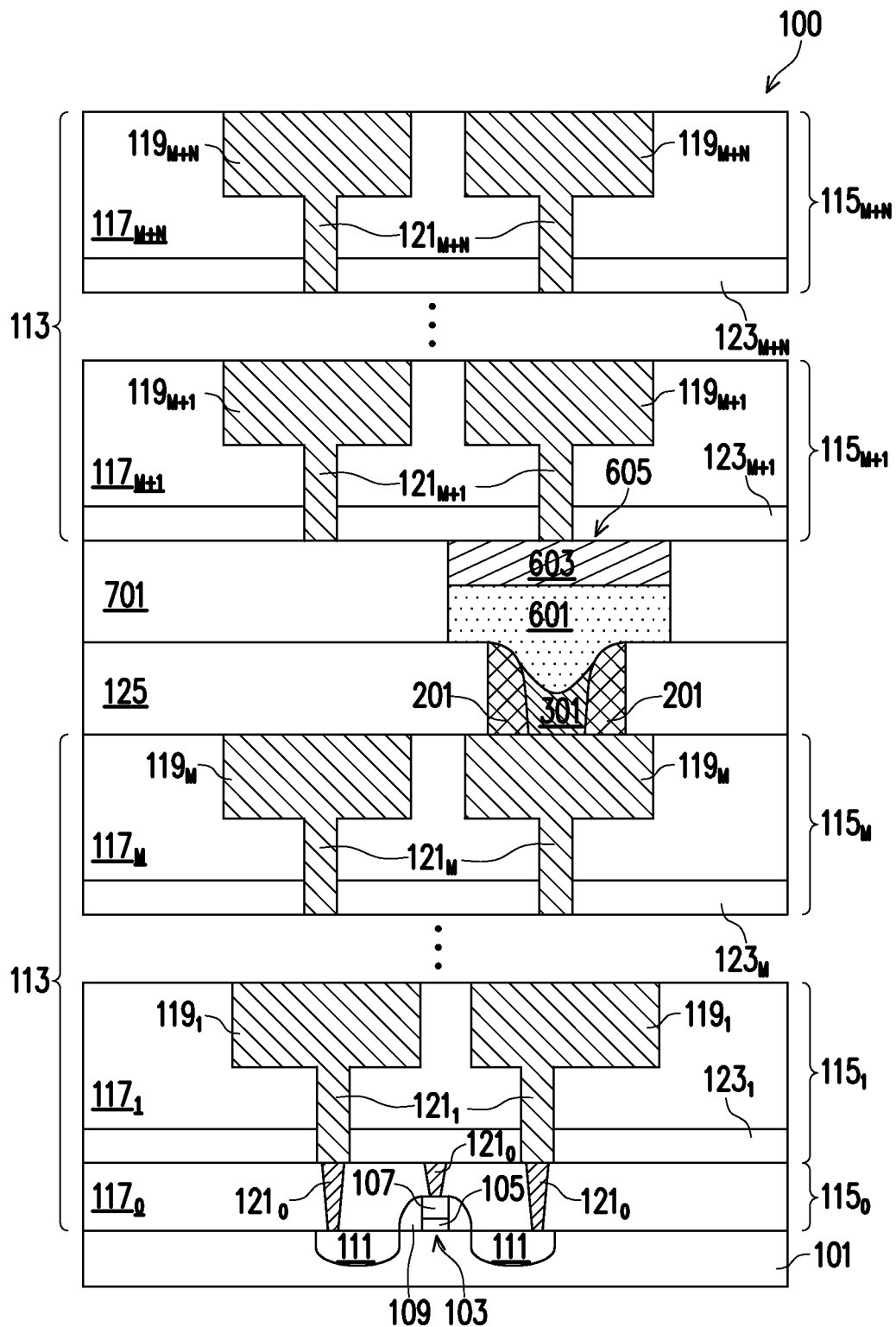

Referring to FIG. 7, a dielectric layer 701 is formed over the dielectric layer 125 and surrounding the PCRAM structure 605. In some embodiments, the dielectric layer 701 may be formed using similar material and methods as the dielectric layer 125 described above with reference to FIG. 1 and the description is not repeated herein. In some embodiments, the dielectric layer 701 is formed by depositing a suitable dielectric material over the dielectric layer 125 and the PCRAM structure 605 and performing a planarization process on the dielectric material to remove portions of the dielectric material extending above a topmost surface of the PCRAM structure 605. The planarization process may comprise a CMP process, an etching process, a grinding process, a combination thereof, or the like. After performing the planarization process, a topmost surface of the dielectric layer 701 is substantially coplanar or level with the topmost surface of the PCRAM structure 605 within process variations of the planarization process.

Subsequently, additional metallization layers $115_{M+1}$ to $115_{M+N}$ are formed over the dielectric layer 701 and the PCRAM structure 605, with the metallization layer $115_{M+N}$ being the last metallization layer of the interconnect structure 113. In some embodiments, the conductive via $121_{M+1}$ is in physical contact with the conductive layer 603 of the PCRAM structure 605. In some embodiments, the dielectric layers $117_{M+X}$ (with X=1, . . . , N) may be formed using similar materials and methods as the dielectric layers $117_0$ to $117_M$ described above with reference to FIG. 1, and the description is not repeated herein. In some embodiments, the ESLs $123_{M+X}$ (with X=1, . . . , N) may be formed using similar materials and methods as the ESLs $123_1$ to $123_M$ described above with reference to FIG. 1, and the description is not repeated herein. In some embodiments, the conductive lines $119_{M+X}$ with X=1, . . . , N) may be formed using similar materials and methods as the conductive lines $119_1$ to $119_M$ described above with reference to FIG. 1, and the description is not repeated herein. In some embodiments, the conductive vias $121_{M+X}$ (with X=1, . . . , N) may be formed using similar materials and methods as the conductive vias $121_1$ to $121_M$ described above with reference to FIG. 1, and the description is not repeated herein. In some embodiments, N is equal to 1. In other embodiments, N is greater than 1.

Figure 8:
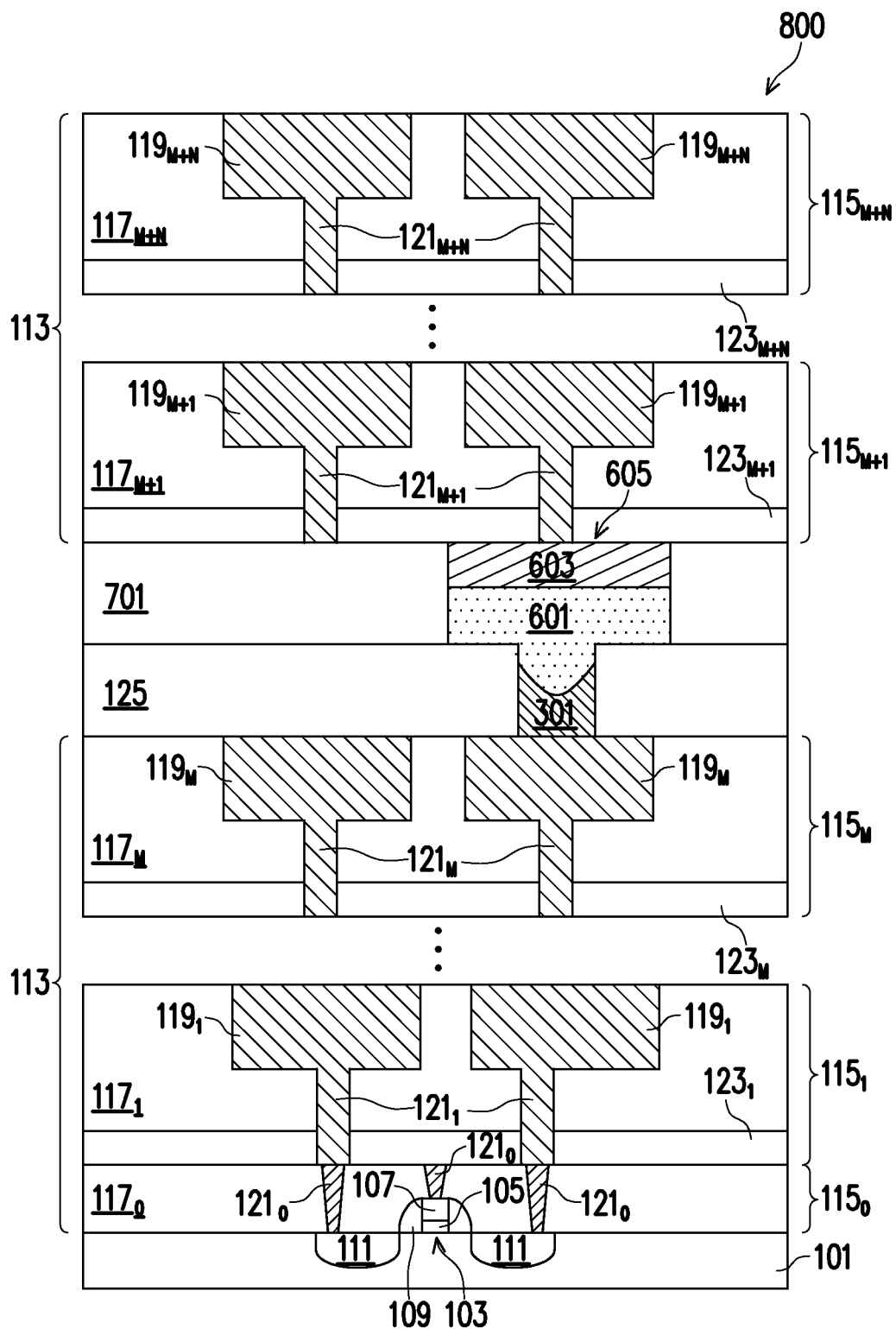
FIG. 8 illustrates a cross-sectional view of a PCRAM cell in accordance with some embodiments.

FIG. 8 illustrates a cross-sectional view of a PCRAM cell 800 in accordance with some embodiments. In some embodiments, the PCRAM cell 800 may be similar to the PCRAM cell 100 illustrated in FIG. 7, with similar features of the PCRAM cell 800 and the PCRAM cell 100 being labeled with similar numerical references and descriptions of the similar features are not repeated herein. In some embodiments, the PCRAM cell 800 may be formed using process steps described above with reference to FIG. 1-7, but omitting the formation of the spacers 201. In the illustrated embodiment, the conductive layer 301 is physical contact with sidewalls of the dielectric layer 125.

Figure 9:
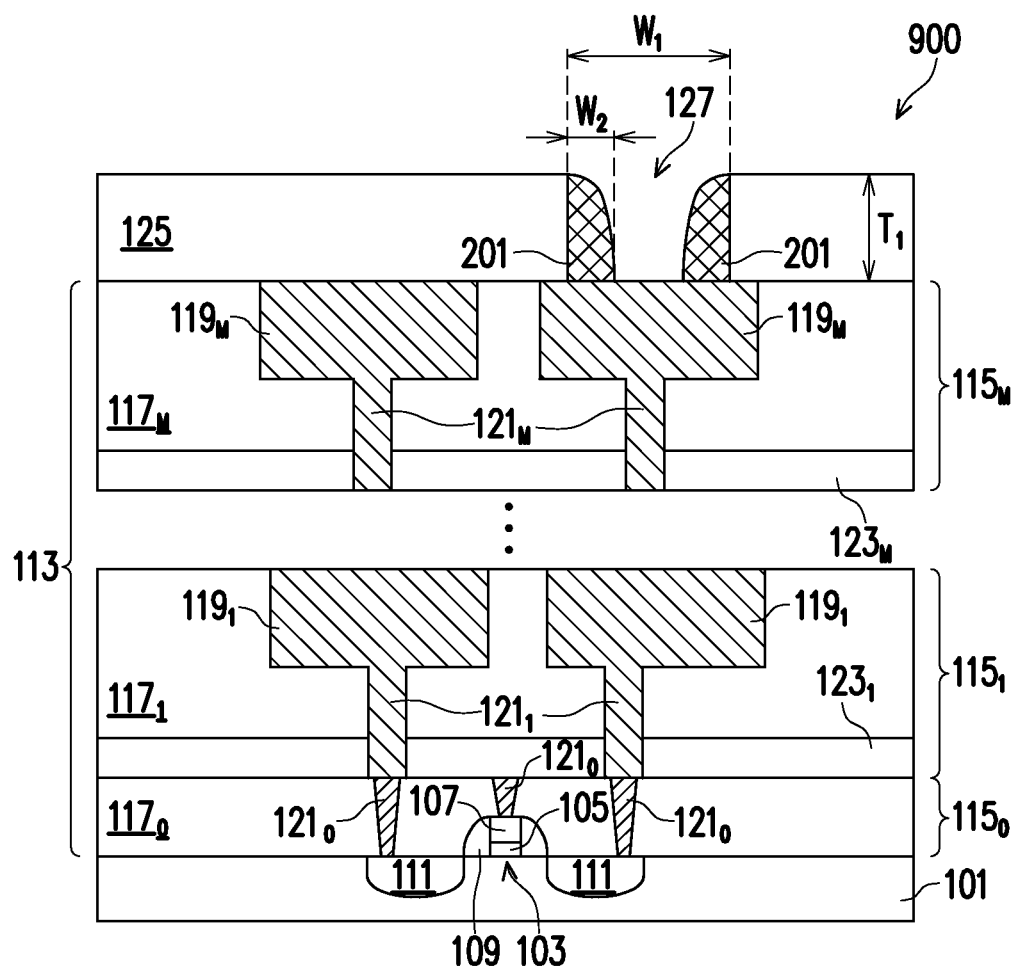
FIGS. 9-14 illustrate cross-sectional views of intermediate stages in the manufacturing of a PCRAM cell in accordance with some embodiments.

FIGS. 9-14 illustrate cross-sectional views of intermediate stages in the manufacturing of a PCRAM cell 900 in accordance with some embodiments. In some embodiments, the structure illustrated in FIG. 9 is similar to the structure illustrated in FIG. 2, with similar features being labeled with similar numerical references and descriptions of the similar features are not repeated herein. In some embodiments, the structure illustrated in FIG. 9 may be formed using process steps described above with reference to FIGS. 1 and 2, and the description is not repeated herein.

Figure 10:
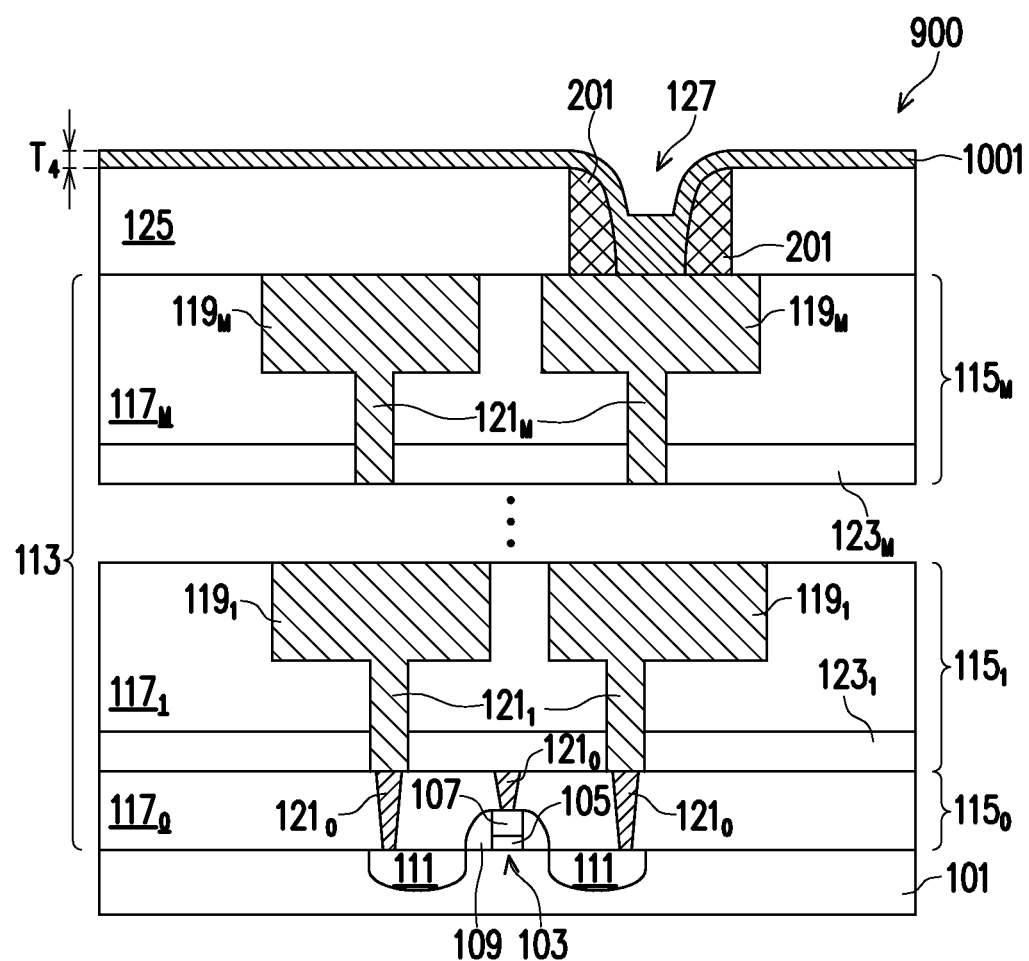

Referring to FIG. 10, a conductive material 1001 is conformally deposited over the dielectric layer 125 and in the opening 127. In some embodiments, the conductive material 1001 may comprise a conductive material such as Ti, Co, W, Ru, C, WN, TiN, TiW, TiAl, TiAlN, a combination thereof, a multilayer thereof, or like, and may be formed using CVD, ALD, a combination thereof, or the like. In some embodiments, the conductive material 1001 partially fills the opening 127. In some embodiments, the conductive material 1001 has thickness $T_4$ between about 1 nm and about 16 nm as measured from the topmost surface of the dielectric layer 125.

Figure 11:
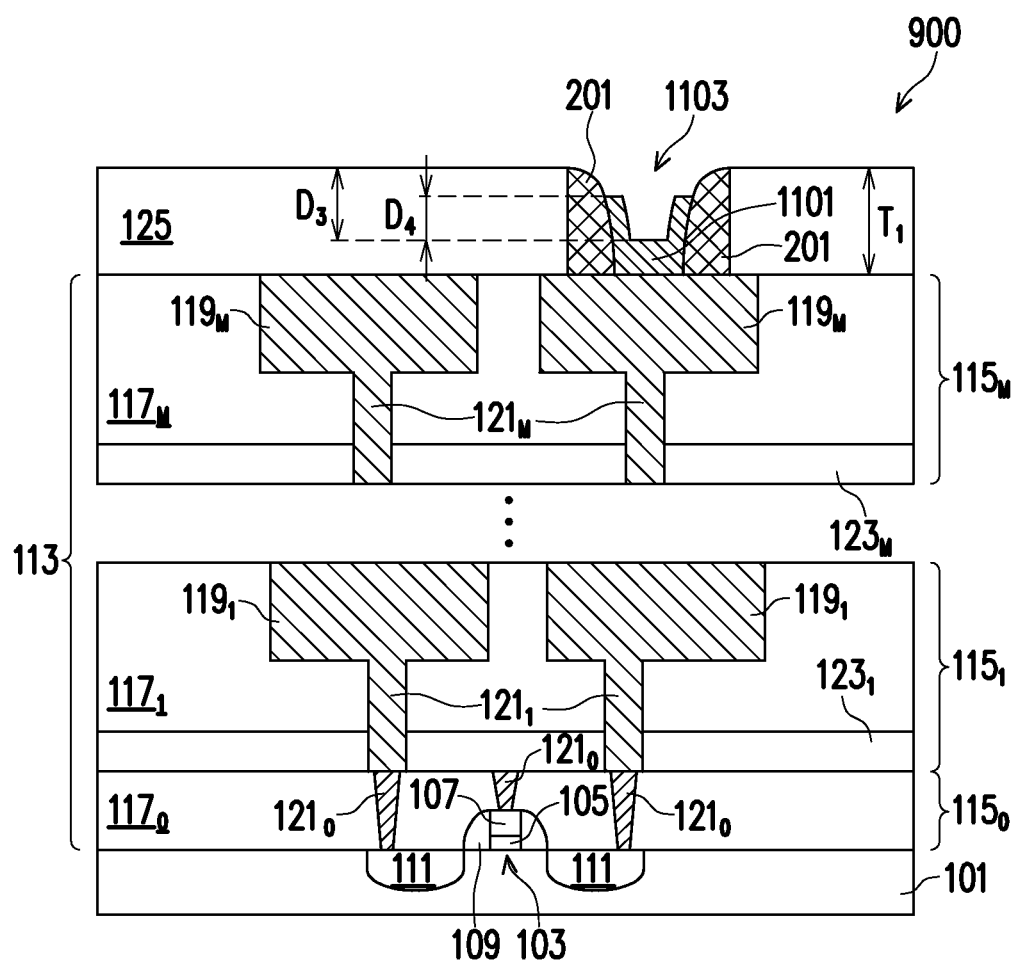

Referring to FIG. 11, the conductive material 1001 (see FIG. 10) is etched back to remove a first portion of the conductive material 1001 over the dielectric layer 125 and reduce a thickness of a second portion of the conductive material 1001 within the opening 127 as measured from a bottom of the opening 127. In some embodiments, the etch back process is preformed using a suitable etching process. The suitable etching process may be a chemical etch process having high etch selectively for the conductive material 1001 over the spacers 201 and the dielectric layer 125. The remaining portion of the conductive material 1001 forms a conductive layer 1101. The conductive layer 1101 may be also referred to as a bottom electrode. In some embodiments, the etch back process forms a recess 1103 extending between the spacers 201 and into the conductive layer 1101. In some embodiments, the conductive layer 1101 has a concave top surface. In some embodiments, a bottom of the recess 1103 is located a depth $D_3$ below the dielectric layer 125. In some embodiments, the recess 1103 extends from a topmost surface of the conductive layer 1101 into the conductive layer 1101 to a depth $D_4$. In some embodiments, a width of the recess 1103 decreases as the recess 1103 extends into the conductive layer 1101 toward the substrate 101. In some embodiments, the depth $D_3$ is between about 5 nm and about 50 nm. In some embodiments, the depth $D_4$ is between about 0.5 nm and about 20 nm. In some embodiments, a ratio $D_3/D_4$ is between about 5 and about 60. In some embodiments, a ratio $D_3/T_1$ is between about 0.2 and about 0.7. In some embodiments, a ratio $D_4/T_1$ is between about 0.01 and about 0.2.

Figure 12:
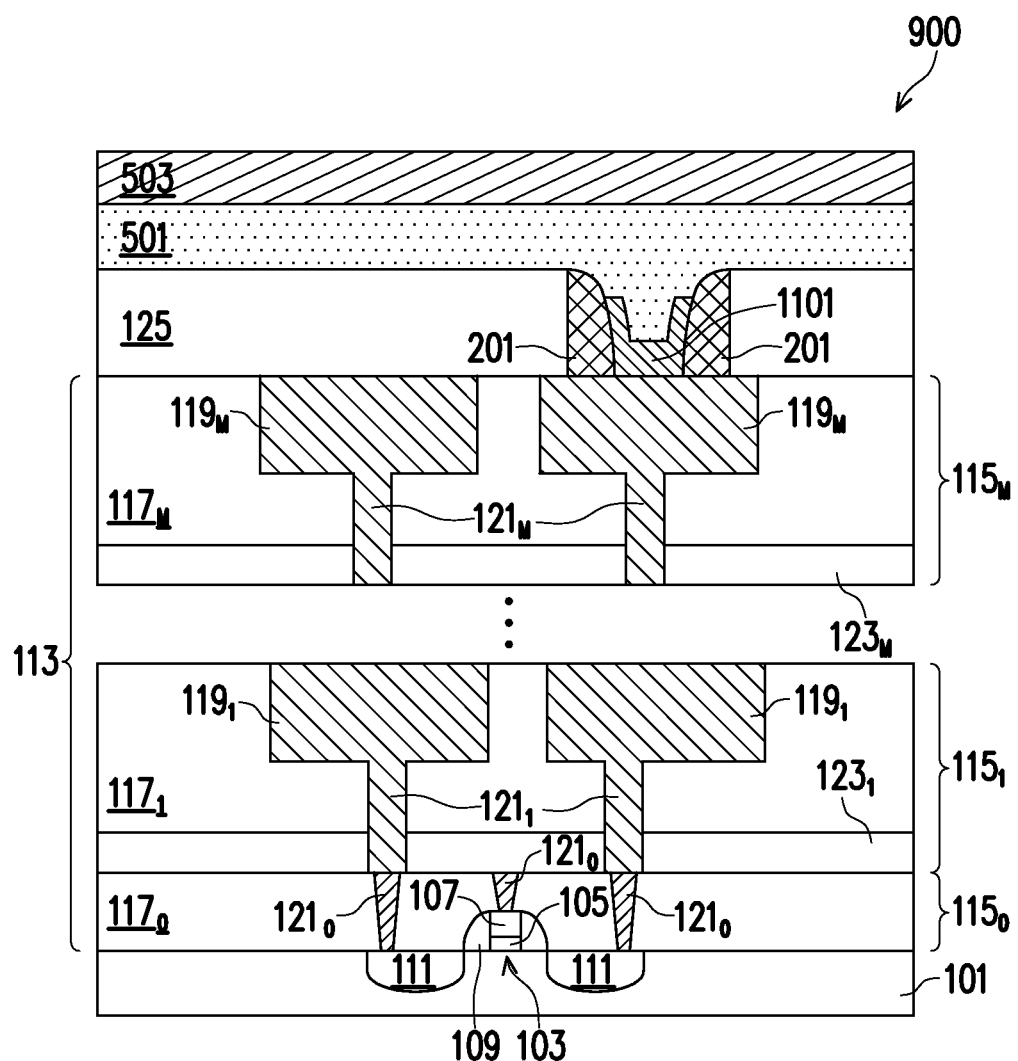

Referring to FIG. 12, a phase-change material 501 is blanket deposited over the conductive layer 1101 and the dielectric layer 125, and the conductive material 503 is blanket deposited over the phase-change material 501. In some embodiments, the phase-change material 501 and the conductive material 503 may be formed as described above with reference to FIG. 5 and the description is not repeated herein. In some embodiments, the conductive layer 1101 and the conductive material 503 may comprise a same material. In other embodiments, the conductive layer 1101 and the conductive material 503 may comprise different materials.

Figure 13:
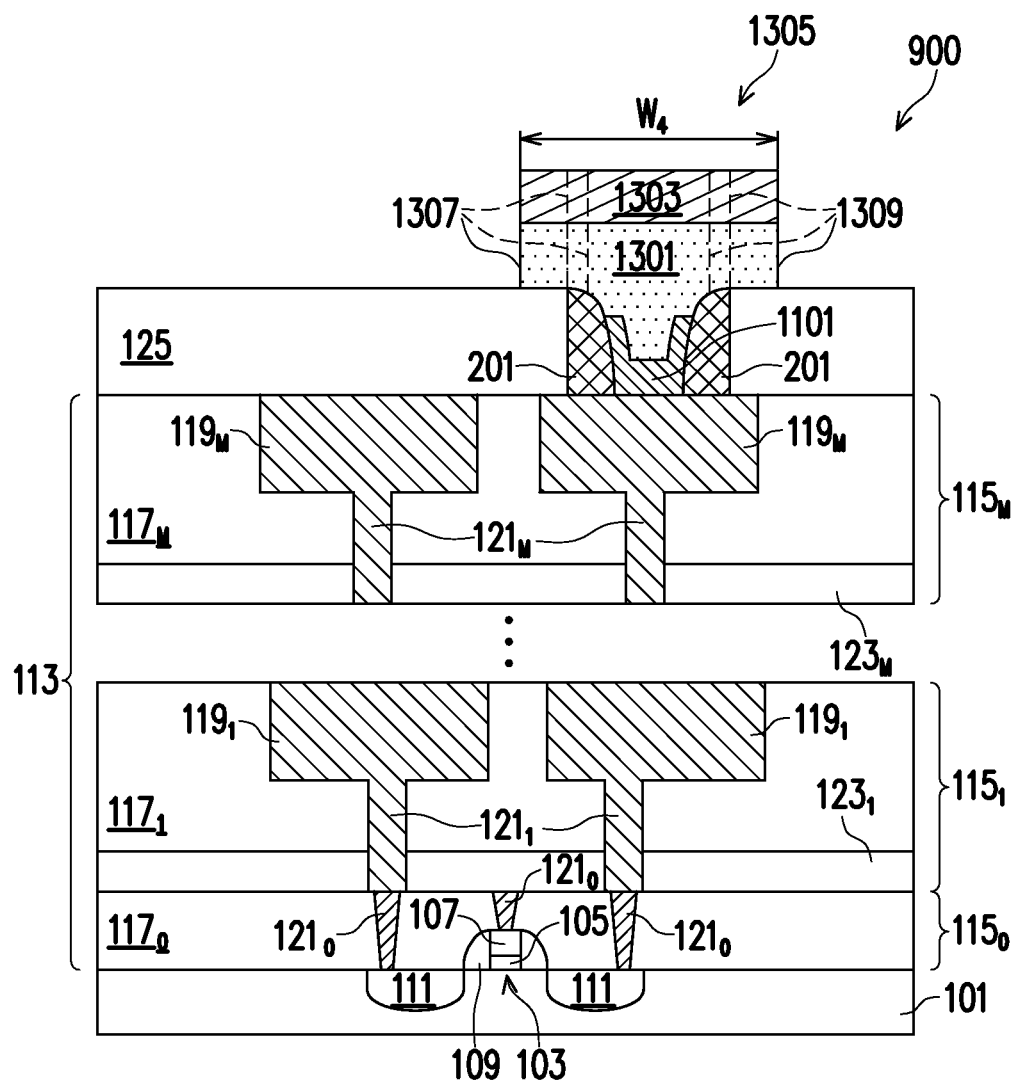

Referring to FIG. 13, the phase-change material 501 and the conductive material 503 (see FIG. 12) are patterned, such that the conductive layer 1101 and remaining portions of the phase-change material 501 and the conductive material 503 form a PCRAM structure 1305. In some embodiments, the phase-change material 501 and the conductive material 503 may be patterned using suitable photolithography and etching methods. In some embodiments, a single mask may be used to pattern the phase-change material 501 and the conductive material 503. The suitable etching processes may comprise one or more dry etching processes, one or more wet etching processes, a combination thereof, or the like. In some embodiments, the phase-change material 501 and the conductive material 503 are patterned using a single etch process, which may be a physical etch process or a chemical etch process. In other embodiments, the phase-change material 501 and the conductive material 503 are patterned using two different etch processes, with the first etch process patterning the conductive material 503 and the second etch process patterning the phase-change material 501. In some embodiments, the first etch process may be a chemical etch process and the second etch process may be a physical etch process. By using the physical etch process, etch damage of the phase-change material 501 is reduced or avoided. In other embodiments, the first etch process may be a first chemical etch process and the second etch process may be a second chemical etch process. The first chemical etch process may be performed using Cl-containing etchants. The second chemical etch process may be performed using suitable etchants without including Cl-containing etchants. By not using Cl-containing etchants in the second chemical etch, etch damage of the phase-change material 501 is reduced or avoided.

In some embodiments, a remaining portion of the phase-change material 501 (see FIG. 12) forms a phase-change layer 1301 and a remaining portion of the conductive material 503 (see FIG. 12) forms a conductive layer 1303, such that the PCRAM structure 1305 comprises the conductive layer 1101, the phase-change layer 1301 over the conductive layer 1101, and the conductive layer 1303 over the phase-change layer 1301. The conductive layer 1303 may also be referred to as a top electrode. In some embodiments, each of the phase-change layer 1301 and the conductive layer 1303 has a width $W_4$ between about 10 nm and about 200 nm.

Referring further to FIG. 13, in some embodiments where the width $W_4$ is less than the width $W_1$ of the opening 127 (see FIG. 9), the phase-change layer 1301 and the conductive layer 1303 completely cover the conductive layer 1101 and partially covers the spacers 201 (as indicated by dashed sidewalls 1307 and 1309 of the PCRAM structure 1305). In other embodiments where the width $W_4$ is equal to the width $W_1$ of the opening 127 (see FIG. 9), the phase-change layer 1301 and the conductive layer 1303 completely cover the conductive layer 1101 and the spacers 201 (as indicated by dashed sidewalls 1307 and 1309 of the PCRAM structure 1305). In yet other embodiments where the width $W_4$ is greater than the width $W_1$ of the opening 127 (see FIG. 9), the phase-change layer 1301 and the conductive layer 1303 completely cover the conductive layer 1101 and the spacers 201, and partially cover the dielectric layer 125 (as indicated by solid sidewalls 1307 and 1309 of the PCRAM structure 1305). In some embodiments, the phase-change layer 1301 extends into the conductive layer 1101 such that a width of the phase-change layer 1301 decreases as the phase-change layer 1301 extends into the conductive layer 1101 toward the substrate 101. In some embodiments, the phase-change layer 1301 has a convex bottom surface.

By forming the recess 1103 in the conductive layer 1101 of the PCRAM structure 1305 as described above with reference to FIGS. 10 and 11, a width of the conductive layer 1101 is reduced without using advanced photolithography and etch processes, which allows for process cost reduction. By reducing the width of the conductive layer 1101, a write current and a write power of the PCRAM cell 900 are reduced.

Figure 14:
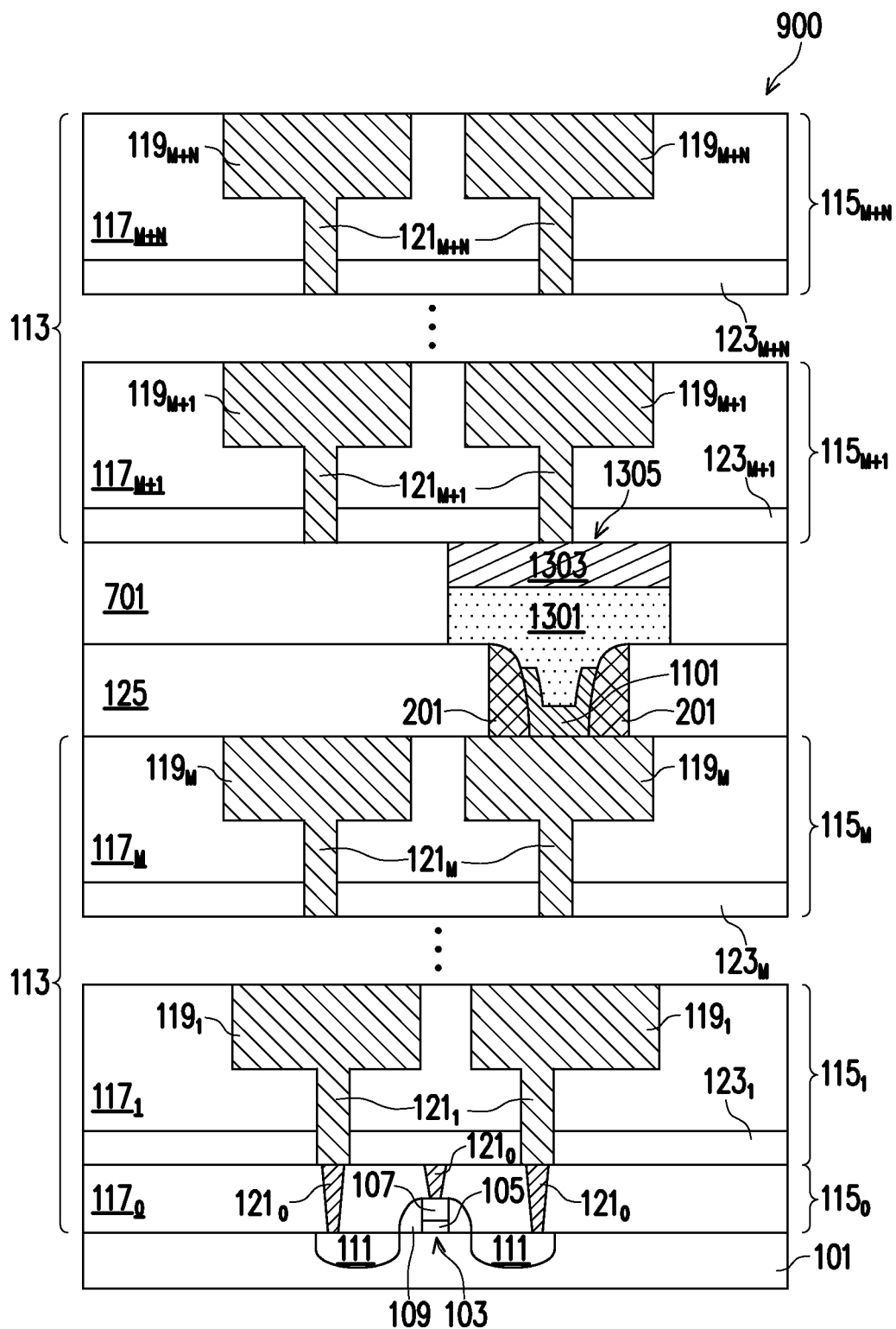

Referring to FIG. 14, a dielectric layer 701 is formed over the dielectric layer 125 and surrounding the PCRAM structure 1305. In some embodiments, the dielectric layer 701 is formed using process steps described above with reference to FIG. 7 and the description is not repeated herein. Subsequently, additional metallization layers $115_{M+1}$ to $115_{M+N}$ are formed over the dielectric layer 701 and the PCRAM structure 1305, with the metallization layer $115_{M+N}$ being the last metallization layer of the interconnect structure 113. In some embodiments, the conductive via $121_{M+1}$ is in physical contact with the conductive layer 1303 of the PCRAM structure 1305. In some embodiments, the metallization layers $115_{M+1}$ to $115_{M+N}$ are formed using process steps described above with reference to FIG. 7 and the description is not repeated herein.

Figure 15:
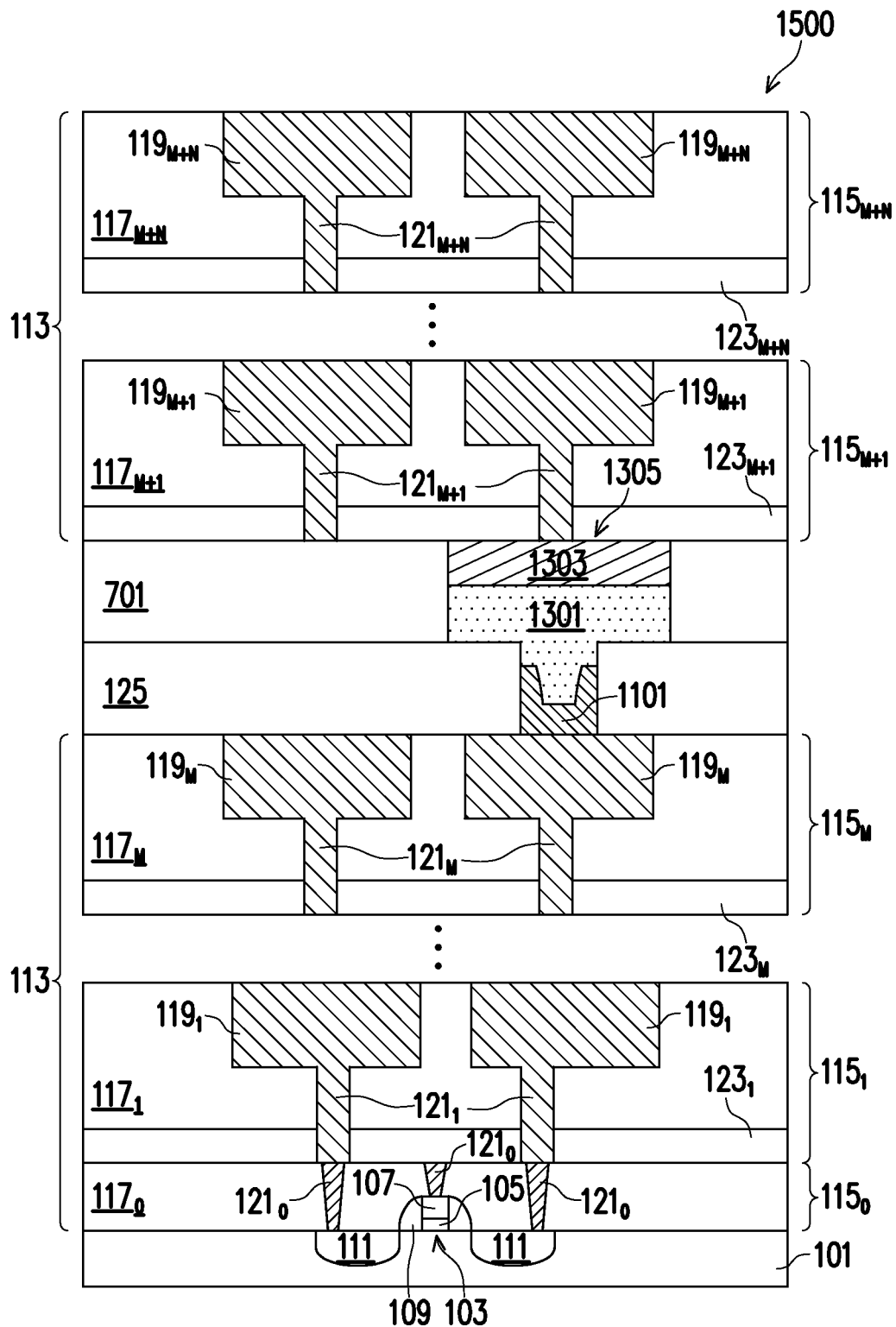
FIG. 15 illustrates a cross-sectional view of a PCRAM cell in accordance with some embodiments.

FIG. 15 illustrates a cross-sectional view of a PCRAM cell 1500 in accordance with some embodiments. In some embodiments, the PCRAM cell 1500 may be similar to the PCRAM cell 900 illustrated in FIG. 14, with similar features of the PCRAM cell 1500 and the PCRAM cell 900 being labeled with similar numerical references and descriptions of the similar features are not repeated herein. In some embodiments, the PCRAM cell 1500 may be formed using process steps described above with reference to FIG. 9-14, but omitting the formation of the spacers 201. In the illustrated embodiment, the conductive layer 1101 is physical contact with sidewalls of the dielectric layer 125.

Figure 16:
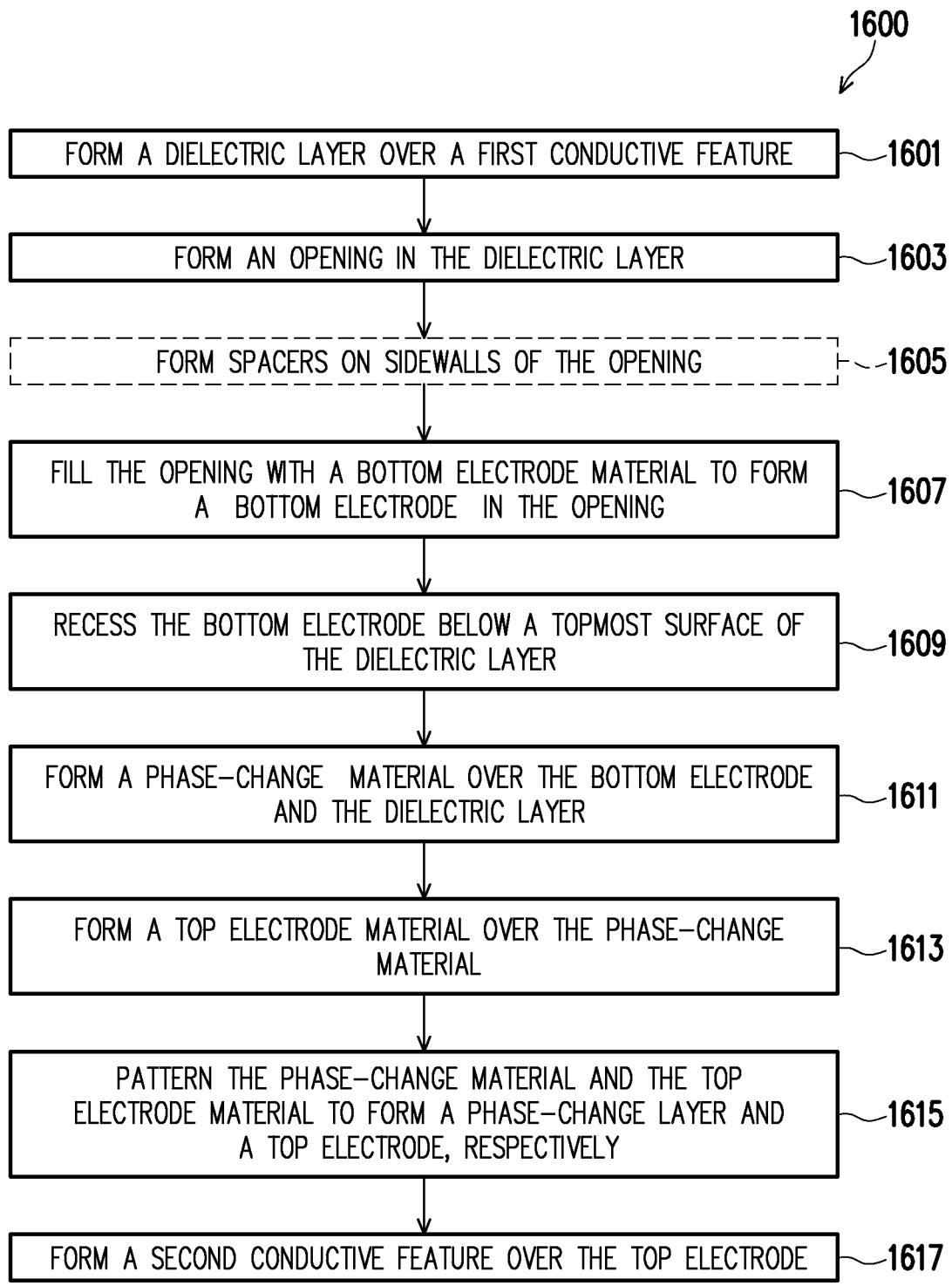
FIG. 16 is a flow diagram illustrating a method of forming a PCRAM cell in accordance with some embodiments.

FIG. 16 is a flow diagram illustrating a method 1600 of forming a PCRAM cell in accordance with some embodiments. The method 1600 starts with step 1601, where a dielectric layer (such as the dielectric layer 125 illustrated in FIG. 1) is formed over a first conductive feature (such as the conductive line $119_M$ illustrated in FIG. 1) as described above with reference to FIG. 1. In step 1603, an opening (such as the opening 127 illustrated in FIG. 1) is formed in the dielectric layer as described above with reference to FIG. 1. In step 1605, spacers (such as the spacers 201 illustrated in FIG. 2) are formed on sidewalls of the opening as described above with reference to FIG. 2. In step 1607, the opening is filled with a bottom electrode material to form a bottom electrode (such as the conductive layer 301 illustrated in FIG. 3) in the opening as described above with reference to FIG. 3. In step 1609, the bottom electrode is recessed below a topmost surface of the dielectric layer as described above with reference to FIG. 4. In step 1611, a phase-change material (such as the phase-change material 501 illustrated in FIG. 5) is formed over the bottom electrode and the dielectric layer as described above with reference to FIG. 5. In step 1613, a top electrode material (such as the conductive material 503 illustrated in FIG. 5) is formed over the phase-change material as described above with reference to FIG. 5. In step 1615, the phase-change material and the top electrode material are patterned to form a phase-change layer (such as the phase-change layer 601 illustrated in FIG. 6) and a top electrode (such as the conductive layer 603 illustrated in FIG. 6), respectively, as described above with reference to FIG. 6. In step 1617, a second conductive feature (such as the conductive via $121_{M+1}$ illustrated in FIG. 7) is formed over the top electrode as described above with reference to FIG. 7. In some embodiments, step 1605 may be omitted.

Figure 17:
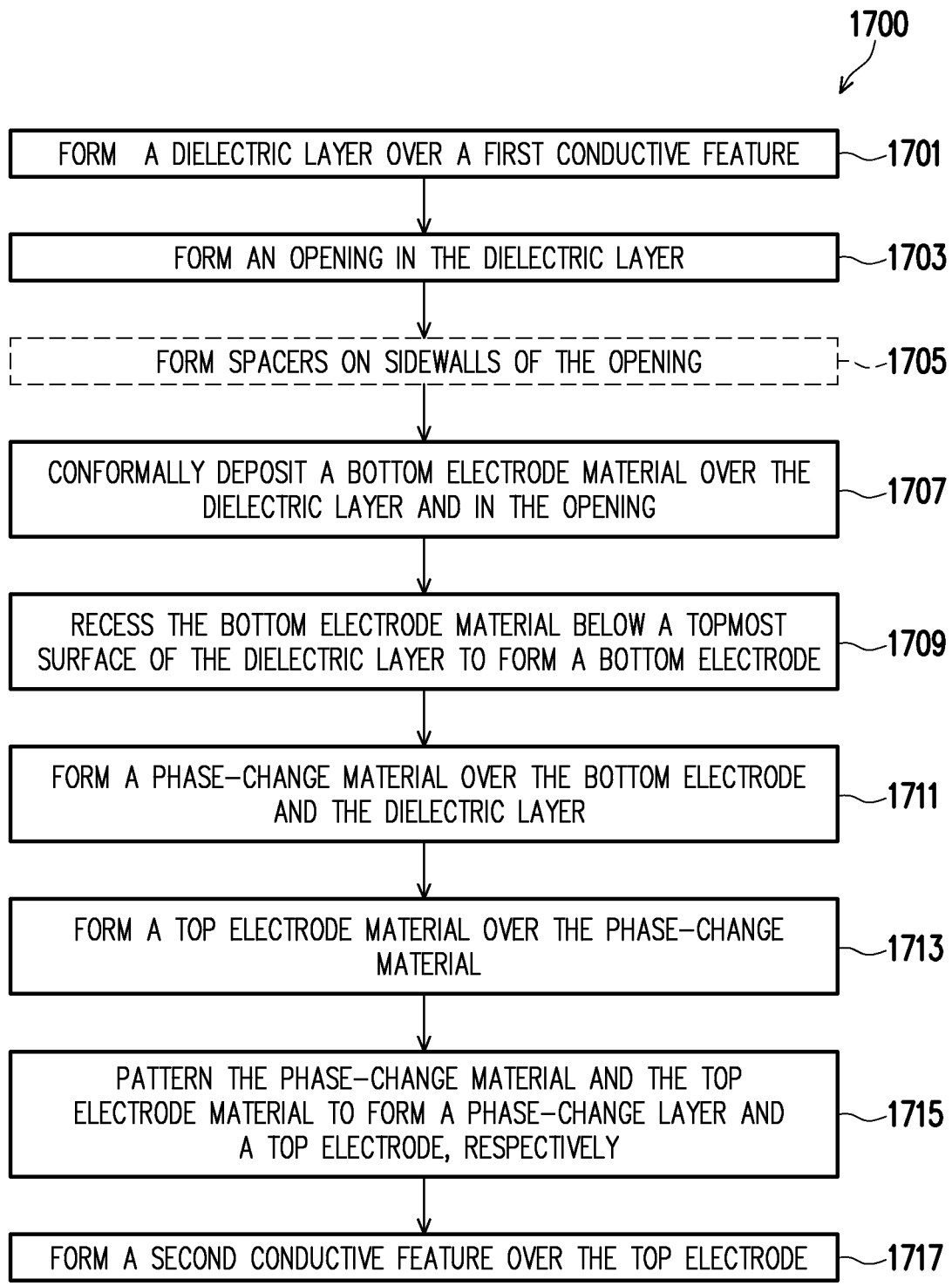
FIG. 17 is a flow diagram illustrating a method of forming a PCRAM cell in accordance with some embodiments.

FIG. 17 is a flow diagram illustrating a method 1700 of forming a PCRAM cell in accordance with some embodiments. The method 1700 starts with step 1701, where a dielectric layer (such as the dielectric layer 125 illustrated in FIG. 9) is formed over a first conductive feature (such as the conductive line 119$_M$ illustrated in FIG. 9) as described above with reference to FIG. 9. In step 1703, an opening (such as the opening 127 illustrated in FIG. 9) is formed in the dielectric layer as described above with reference to FIG. 9. In step 1705, spacers (such as the spacers 201 illustrated in FIG. 9) are formed on sidewalls of the opening as described above with reference to FIG. 9. In step 1707, a bottom electrode material (such as the conductive material 1001 illustrated in FIG. 10) is conformally deposited over the dielectric layer and in the opening as described above with reference to FIG. 10. In step 1709, the bottom electrode material is recessed below a topmost surface of the dielectric layer to form a bottom electrode (such as the conductive layer 1101 illustrated in FIG. 11) as described above with reference to FIG. 11. In step 1711, a phase-change material (such as the phase-change material 501 illustrated in FIG. 12) is formed over the bottom electrode and the dielectric layer as described above with reference to FIG. 12. In step 1713, a top electrode material (such as the conductive material 503 illustrated in FIG. 12) is formed over the phase-change material as described above with reference to FIG. 12. In step 1715, the phase-change material and the top electrode material are patterned to form a phase-change layer (such as the phase-change layer 1301 illustrated in FIG. 13) and a top electrode (such as the conductive layer 1303 illustrated in FIG. 13), respectively, as described above with reference to FIG. 13. In step 1717, a second conductive feature (such as the conductive via 121$_{M+1}$ illustrated in FIG. 14) is formed over the top electrode as described above with reference to FIG. 14. In some embodiments, step 1705 may be omitted.

In an embodiment, a device includes: a substrate; a first dielectric layer over the substrate; a bottom electrode extending through the first dielectric layer; a phase-change layer over the bottom electrode, the phase-change layer including: a first portion extending into the bottom electrode, wherein a width of the first portion decreases as the first portion extends toward the substrate; and a second portion over the first portion and the first dielectric layer, wherein the second portion has a first width; and a top electrode over the phase-change layer, wherein the top electrode has the first width.

In another embodiment, a device includes: a substrate; a first dielectric layer over the substrate; a first conductive feature within the first dielectric layer; a second dielectric layer over the first conductive feature and the first dielectric layer; a bottom electrode within the second dielectric layer, wherein the bottom electrode is electrically connected to the first conductive feature, and wherein a top surface of the bottom electrode is below a top surface of the second dielectric layer; a phase-change layer over the bottom electrode, the phase-change layer including: a first portion extending into the bottom electrode, wherein the first portion has a convex bottom surface; and a second portion over the first portion and the second dielectric layer, wherein the second portion is wider than the first portion; a top electrode over the phase-change layer, wherein the top electrode and the second portion of the phase-change layer have a same width; a third dielectric layer over the second dielectric layer, wherein the third dielectric layer is in physical contact with sidewalls of the phase-change layer and sidewalls of the top electrode; a fourth dielectric layer over the third dielectric layer and the top electrode; and a second conductive feature within the fourth dielectric layer, wherein the second conductive feature is electrically connected to the top electrode.

In yet another embodiment, a method includes: forming a first dielectric layer over a substrate; forming a first conductive feature in the first dielectric layer; forming a second dielectric layer over the first dielectric layer and the first conductive feature; forming an opening in the second dielectric layer, wherein the opening exposes a portion of a top surface of the first conductive feature; forming spacers on sidewalls of the opening; filling the opening with a first conductive material to form a bottom electrode in the opening; recessing the bottom electrode below a top surface of the second dielectric layer to form a recess, wherein the recess extends into the bottom electrode, and wherein a width of the recess decreases as the recess extends into the bottom electrode toward the substrate; depositing a phase-change material in the recess and over the second dielectric layer; depositing a second conductive material over the phase-change material; and performing a patterning process to remove portions of the phase-change material and the second conductive material and to expose the top surface of the second dielectric layer, wherein a remaining portion of the phase-change material forms a phase-change layer, and wherein a remaining portion of the second conductive material forms a top electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a substrate;
   a first dielectric layer over the substrate;
   a bottom electrode extending through the first dielectric layer;
   a spacer along a sidewall of the bottom electrode;
   a phase-change layer over the bottom electrode, the phase-change layer comprising:
      a first portion extending into the bottom electrode, wherein a width of the first portion decreases as the first portion extends toward the substrate; and
      a second portion over the first portion and the first dielectric layer, wherein the second portion has a first width;
   a top electrode over the phase-change layer, the top electrode and the bottom electrode comprising a same material, wherein the top electrode has the first width; and
   a second dielectric layer over the first dielectric layer, the second dielectric layer extending along sidewalls of the phase-change layer and sidewalls of the top electrode, the second dielectric layer being in physical contact with a top surface of the spacer.

2. The device of claim 1, wherein the bottom electrode has a concave top surface.

3. The device of claim 1, wherein the first portion of the phase-change layer extends below a top surface of the first dielectric layer.

4. The device of claim 1, wherein the first portion of the phase-change layer extends below a top surface of the spacer.

5. The device of claim 1, wherein a top surface of the top electrode is substantially level with a top surface of the second dielectric layer.

6. The device of claim 1, wherein the bottom electrode comprises a recess, the recess extending below a top surface of first dielectric layer to a first depth, the first depth being between about 5 nm and about 50 nm.

7. The device of claim 6, wherein the recess extends below a top surface of the bottom electrode to a second depth, the second depth being between about 0.5 nm and about 20 nm, a ratio of the first depth to the second depth being between about 5 and about 60.

8. A device comprising:
a substrate;
a first dielectric layer over the substrate;
a first conductive feature within the first dielectric layer;
a second dielectric layer over the first conductive feature and the first dielectric layer;
a bottom electrode within the second dielectric layer, wherein the bottom electrode is electrically connected to the first conductive feature, and wherein a top surface of the bottom electrode is below a top surface of the second dielectric layer;
a first spacer in physical contact with a first sidewall of the bottom electrode, wherein a topmost portion of the first spacer is level with a top surface of the second dielectric layer;
a second spacer in physical contact with a second sidewall of the bottom electrode, the second sidewall of the bottom electrode being opposite to the first sidewall of the bottom electrode, a width of the first conductive feature being greater than a combined width of the first spacer, the second spacer and the bottom electrode;
a phase-change layer over the bottom electrode, the phase-change layer comprising:
a first portion extending into the bottom electrode, wherein the first portion has a convex bottom surface; and
a second portion over the first portion and the top surface of the second dielectric layer, wherein the second portion is wider than the first portion and narrower than combined width of the first spacer, the second spacer and the bottom electrode;
a top electrode over the phase-change layer, wherein the top electrode and the second portion of the phase-change layer have a same width;
a third dielectric layer over the second dielectric layer, wherein the third dielectric layer is in physical contact with sidewalls of the phase-change layer and sidewalls of the top electrode;
a fourth dielectric layer over the third dielectric layer and the top electrode; and
a second conductive feature within the fourth dielectric layer, wherein the second conductive feature is electrically connected to the top electrode.

9. The device of claim 8, wherein a bottom surface of the bottom electrode is substantially level with a bottom surface of the first spacer.

10. The device of claim 8, wherein the first spacer is in physical contact with the phase-change layer.

11. The device of claim 8, wherein a height of the first spacer is greater that a height of the bottom electrode.

12. The device of claim 8, wherein a width of the bottom electrode decreases as the bottom electrode extends from a top surface of the bottom electrode toward the substrate.

13. The device of claim 8, wherein a top surface of the top electrode is substantially level with a top surface of the third dielectric layer.

14. The device of claim 8, wherein a width of the second conductive feature is less than a width of the top electrode.

15. A device comprising:
a substrate;
a first interconnect structure over the substrate;
a first dielectric layer over the first interconnect structure, wherein a bottommost surface of the first dielectric layer extends along and is in physical contact with a topmost surface of the first interconnect structure;
a bottom electrode embedded in the first dielectric layer and electrically coupled to the first interconnect structure, the bottom electrode being interposed between a first sidewall and a second sidewall of the first dielectric layer, wherein a thickness of the bottom electrode is less than a thickness of the first dielectric layer;
a phase-change layer over the bottom electrode, the phase-change layer comprising:
a first portion extending from a topmost surface of the first dielectric layer toward the bottom electrode; and
a second portion over the first portion and the first dielectric layer, wherein a width of the second portion is greater than a width of the bottom electrode;
a top electrode over the phase-change layer, wherein a width of the top electrode is greater than the width of the bottom electrode; and
a second dielectric layer over the first dielectric layer, the second portion of the phase-change layer and the top electrode being interposed between a first sidewall and a second sidewall of the second dielectric layer, wherein a first distance between the first sidewall and the second sidewall of the second dielectric layer is less than a second distance between the first sidewall and the second sidewall of the first dielectric layer.

16. The device of claim 15, further comprising a second interconnect structure over and in electrical contact with the top electrode.

17. The device of claim 15, wherein an interface between the bottom electrode and the first portion of the phase-change layer is curved toward the substrate.

18. The device of claim 15, further comprising a spacer embedded in the first dielectric layer and extending along a sidewall of the bottom electrode, wherein the thickness of the bottom electrode is less than a height of the spacer.

19. The device of claim 15, wherein the phase-change layer comprises a chalcogenide material.

20. The device of claim 15, wherein the width of the top electrode is same as the width of the second portion of the phase-change layer.

* * * * *